United States Patent
Cheng

(10) Patent No.: US 8,450,759 B2
(45) Date of Patent: May 28, 2013

(54) LIGHT EMITTING DIODE PACKAGE STRUCTURE

(75) Inventor: Tzu-Chi Cheng, Taoyuan County (TW)

(73) Assignee: Intematix Technology Center Corporation, Taoyuan County (TW)

( * ) Notice: Subject to any disclaimer, the term of this patent is extended or adjusted under 35 U.S.C. 154(b) by 331 days.

(21) Appl. No.: 13/017,285

(22) Filed: Jan. 31, 2011

(65) Prior Publication Data

US 2012/0098001 A1 Apr. 26, 2012

(30) Foreign Application Priority Data

Oct. 20, 2010 (TW) ................................ 99135824 A

(51) Int. Cl.
- H01L 33/54 (2010.01)
- H01L 33/56 (2010.01)
- H01L 33/50 (2010.01)
- H01L 33/48 (2010.01)
- H01L 33/52 (2010.01)

(52) U.S. Cl.
CPC ............ *H01L 33/507* (2013.01); *H01L 33/483* (2013.01); *H01L 33/52* (2013.01)
USPC ........ 257/98; 257/99; 257/100; 257/E33.058; 257/E33.059

(58) Field of Classification Search
CPC ........ H01L 33/507; H01L 33/483; H01L 33/52
USPC .............. 257/98, 99, 100, E33.058, E33.059
See application file for complete search history.

(56) References Cited

U.S. PATENT DOCUMENTS

| | | | | |
|---|---|---|---|---|
| 5,959,316 A * | 9/1999 | Lowery | ............................ | 257/98 |
| 6,576,488 B2 | 6/2003 | Collins, III et al. | | |
| 6,653,661 B2 * | 11/2003 | Okazaki | ........................... | 257/98 |
| 6,924,514 B2 * | 8/2005 | Suenaga | .......................... | 257/98 |
| 7,301,175 B2 * | 11/2007 | Izuno et al. | ...................... | 257/98 |
| 7,714,342 B2 * | 5/2010 | Lee et al. | .......................... | 257/98 |
| 7,795,052 B2 * | 9/2010 | Lee et al. | .......................... | 438/25 |
| 7,906,904 B2 * | 3/2011 | Kawae et al. | .................. | 313/512 |
| 8,013,352 B2 * | 9/2011 | Lee et al. | .......................... | 257/98 |
| 8,106,584 B2 * | 1/2012 | Tabuchi et al. | ................ | 313/512 |
| 8,207,659 B2 * | 6/2012 | Sato et al. | ....................... | 313/483 |
| 8,324,646 B2 * | 12/2012 | Lee et al. | .......................... | 257/98 |
| 8,330,182 B2 * | 12/2012 | Suenaga | .......................... | 257/99 |
| 2005/0072981 A1 * | 4/2005 | Suenaga | .......................... | 257/88 |
| 2010/0044726 A1 * | 2/2010 | Li et al. | ............................ | 257/88 |
| 2010/0164367 A1 * | 7/2010 | Shioi et al. | ..................... | 313/503 |
| 2011/0037078 A1 * | 2/2011 | Lee et al. | .......................... | 257/84 |

* cited by examiner

*Primary Examiner* — Evan Pert
(74) *Attorney, Agent, or Firm* — Morris Manning & Martin LLP; Tim Tingkang Xia, Esq.

(57) ABSTRACT

A light emitting diode (LED) package structure includes a substrate, at least one enclosure made of a transparent material, an LED, a first package material, and a second package material. The enclosure is disposed on a surface of the substrate, and forms a configuration area for disposing the LED therein. The first package material made of a transparent material is disposed in the configuration area and covers the LED. The second package material containing a fluorescent material covers the enclosure, the LED, and the first package material.

18 Claims, 2 Drawing Sheets

LIGHT EMITTING DIODE PACKAGE STRUCTURE

CROSS-REFERENCE TO RELATED APPLICATIONS

This non-provisional application claims priority under 35 U.S.C. §119(a) on Patent Application No(s). 099135824 filed in Taiwan, R.O.C. on Oct. 20, 2010, the entire contents of which are hereby incorporated by reference.

BACKGROUND OF THE INVENTION

1. Field of Invention

The present invention relates to a package structure, and more particularly to a light emitting diode (LED) package structure of a package type in which light emitting elements do not directly contact a fluorescent material.

2. Related Art

Due to low power consumption, high efficiency, and long life, LEDs are widely used in various application fields, for example, as light sources for backlight modules of notebook computers, monitors, mobile phones, TV sets, and liquid crystal displays (LCDs). Moreover, as more and more researchers work on the research and development of the LEDs, the luminous intensity of the LEDs already reaches a lighting level for daily life at present.

For example, the most commonly used white LED modulates and combines red, green, and blue light, in which the LED chips that emit red, green, and blue light are combined in a form of array and packaged. Color lights emitted by the LEDs of the three colors are mixed, so as to obtain a multi-chip LED package device capable of emitting white light.

The conventional LED package device uses a package having a phosphor powder added therein to directly cover the LED chips, that is, the LEDs directly contact and join the phosphor powder for refracting the light. In the conventional method, the phosphor powder is uniformly mixed into the package of a resin material (referred to as uniform distribution) or a mixing region of the phosphor powder is close to a position of the LED chip (referred to as conformal distribution), so as to improve the light color uniformity of the LEDs.

Thus, when the LED chip is in operation, the generated high heat energy will be directly transferred to the package material, and the properties of the phosphor powder change when being heated, resulting in decrease of the overall luminance performance of the LED package device. Moreover, the current LED package techniques cannot achieve the consistency of the spatial spectral distribution and the illumination brightness of the illuminating light.

At present, as the luminous efficiency of the conventional LED is still too low, and the manufacturing cost is relatively high, it is a very important subject to significantly improve the luminous efficiency of the LED and reduce the manufacturing cost of the LED for the research and development personnel in the related field, so as to enhance competitiveness of the LED in the future.

Package technique is one of the import facts that affect the performance of the LED, and in order to improve color uniformity of the LED and achieve high lumen output (light flux), the conventional phosphor powder coating method cannot meet the current requirements of the LED. Therefore, manufacturers have developed a phosphor powder coating method different from the conventional method, for example, the technique recorded in U.S. Pat. No. 6,576,488 (referred to as Patent '488 hereinafter), in which the LED is manufactured by depositing a phosphor layer on a conductive substrate/non-conductive substrate (chip) through electrophoretic coating or by directly attaching a phosphor coated sheet on the chip, so as to improve the luminance performance of the LED.

However, the electrophoretic coating technique disclosed in Patent '488 has the disadvantage of expensive manufacturing cost, so the cost of the LED cannot be reduced, and thus the LED manufactured through this method does not have a price advantage on the market. Furthermore, in the method of attaching the phosphor coated sheet on the chip, the preparation process is complicated as the phosphor coated sheet has to be manufactured additionally; moreover, the step of attaching the phosphor coated sheet must be very accurate, so the yield cannot be controlled, thus resulting in increase of the manufacturing cost.

At present, some manufacturers use a silicone lens as the package material of the LED, so as to increase the index of refraction of the LED, and thereby improving the luminance performance of the LED. In addition to the advantages of high light transmission and high index of refraction, the silicone lens further has excellent properties such as high temperature resistance, high insulation, and high chemical stability, and therefore the silicone lens can be used in the high power LEDs suitably. The silicone lens can endure the high temperature generated during operation of the LED, such that the problem that the conventional package material deteriorates due to high temperature is solved, and the reliability of the LED is significantly improved.

SUMMARY OF THE INVENTION

In view of the above problems, the present invention provides an LED package structure, which can solve problems such as bad luminance performance and non-uniform illumination brightness due to a package material having a phosphor powder added therein directly contacts an LED chip in the conventional LED package device and an excessively high manufacturing cost due to the process of the conventional LED package device being complicated.

In an embodiment of the present invention, an LED package structure is provided, which includes a substrate, a first enclosure, at least one LED, a first package material, a second enclosure, and a second package material. The first enclosure is disposed on a surface of the substrate, and forms a first configuration area on the substrate, and the material of the first enclosure is a transparent material. The LED is disposed in the first configuration area, and is capable of emitting an illuminating light. The first package material is disposed in the first configuration area, and covers the LED, and the material of the first package material is a transparent material. The second enclosure is disposed on the surface of the substrate, and is located outside the first enclosure. A second configuration area is formed between the second enclosure and the first enclosure. The material of the second enclosure is a transparent material. The second package material has a fluorescent material added therein, and the second package material is disposed in the second configuration area, and covers the first enclosure, the LED, and the first package material.

In another embodiment of the present invention, an LED package structure is provided, which includes a substrate, an enclosure, at least one LED, a first package material, and a second package material. The enclosure is disposed on a surface of the substrate, and forms a configuration area on the substrate, and the material of the enclosure is a transparent material. The LED is disposed in the configuration area, and is capable of emitting the illuminating light. The first package material is disposed in the configuration area, and covers the LED, and a material of the first package material is a transparent material. The second package material has a fluorescent material added therein, and the second package material covers the enclosure, the LED, and the first package material.

The present invention has the advantages as follows. Because of the configuration relationship that the LED and the package material having the fluorescent material are separated from each other without direct contact (remote phosphor), a certain distance exists between the LED and the fluorescent material for reflecting the light. Therefore, the overall luminance performance of the LED package structure and the uniformity of the reflected light are improved.

In the LED, the fluorescent material is remote from the heat source, that is to say, the fluorescent material does not directly contact the LED, so the reliability of the LED package structure is improved. Thus, the LED package structure is applicable in a package structure having multiple LEDs, and the manufacturing cost is greatly reduced at the same time.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE INVENTION

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
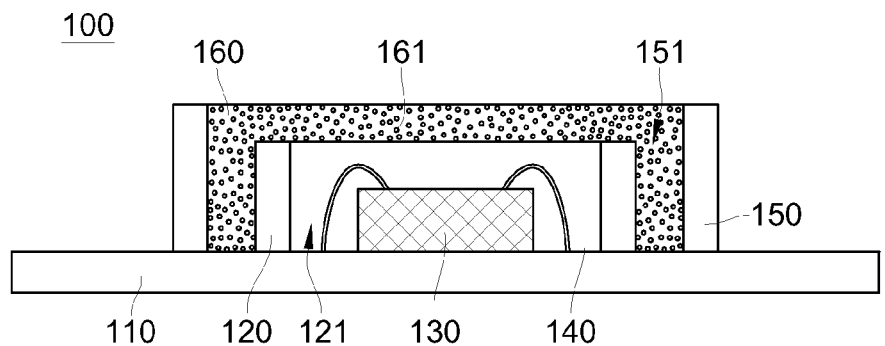
FIG. 1 is a side cross-sectional view according to a first embodiment of the present invention.

FIG. 1 is a side cross-sectional view according to a first embodiment of the present invention. As shown in FIG. 1, an LED package structure 100 according to the first embodiment of the present invention includes a substrate 110, a first enclosure 120, at least one LED 130, a first package material 140, a second enclosure 150, and a second package material 160. The material of the substrate 110 is, but not limited to, one selected from a metal material, a ceramic material, a diamond material, a diamond-like carbon material or a printed circuit board (PCB).

The first enclosure 120 is disposed on a top surface of the substrate 110, and encloses to form a first configuration area 121 on the surface of the substrate 110. It should be noted that the first enclosure 120 and the substrate 110 of the present embodiment are approximately perpendicular to each other. The material of the first enclosure 120 is a transparent material, and the shape of the first configuration area 121 formed by the first enclosure 120 of the embodiment is, for example, but not limited to, a rectangle, a circle, or an oval, and persons skilled in the art may design the first configuration area 121 to various geometric shapes according to practical use requirements.

Furthermore, for optimizing light reflection, the first enclosure 120 may also be designed to be disposed on the substrate 110 at an angle of inclination, or the first enclosure 120 may be designed to be a trapezoid-like structure. Therefore, persons skilled in the art may further design the first enclosure 120 of the present embodiment into forms of various geometric shapes and different placement angles according to practical use requirements.

As shown in FIG. 1, the LED 130 is disposed in the first configuration area 121, that is, the LED 130 is located inside the first enclosure 120. The LED 130 is electrically connected to an electrical source, and is driven by the electrical source to emit the illuminating light. The number of the configured LEDs 130 may be varied according to the practical use requirements, but is not limited to the one LED in the embodiment.

The color of the light emitted by the LED 130 of the embodiment may be various colors such as cool white, warm white, and white light imitating daylight. The illuminating light has high color rendering property, and the illuminating light of the present embodiment has the total reflection effect of normal reflection and horizontal reflection by means of the first enclosure 120, thereby avoiding excessive light loss of the illuminating light during refraction.

Referring to FIG. 1 again, the first package material 140 is filled in the first configuration area 121, and covers the LED 130 completely. The material of the first package material 140 is a transparent material, for example, but not limited to, a polymer material such as epoxy and silicone. Moreover, the first package material 140 is, for example, but not limited to, disposed in the first configuration area 121 through a molding process.

The second enclosure 150 is disposed on a top surface of the substrate 110, the second enclosure 150 is located outside the first enclosure 120, and a distance is defined between the first enclosure 120 and the second enclosure 150. A second configuration area 151 is formed between the second enclosure 150 and the first enclosure 120 (that is, on the surface of the substrate 110). It should be noted that, the second enclosure 150 and the substrate 110 of the present embodiment are approximately perpendicular to each other. The material of the second enclosure 150 is a transparent material, the shape of the second configuration area 151 formed by the second enclosure 150 of the embodiment is, for example, but not limited to, a rectangle, a circle, and an oval, and persons skilled in the art may design the second configuration area 151 to be various geometric shapes.

Furthermore, for optimizing the reflection of the light, the second enclosure 150 may also be designed to be disposed on the substrate 110 at an angle of inclination or the second enclosure 150 may be designed to be a trapezoid-like structure. Therefore, persons skilled in the art may further design the second enclosure 150 of the present embodiment into forms of various geometric shapes and different placement angles according to practical use requirements.

As shown in FIG. 1, the second package material 160 has a first fluorescent material 161 in a powder form added therein.

The second package material 160 is filled in the second configuration area 151, and covers the first enclosure 120, the LED 130 and the first package material 140 completely, so as to form the complete LED package structure 100. The material of the second package material 160 is a transparent material, for example, but not limited to, a polymer material such as epoxy and silicone.

The first fluorescent material 161 added in the second package material 160 is one selected from $Sr_{1-x-y}Ba_xCa_ySiO_4$:$Eu^{2+}F$, $(Sr_{1-x-y}Eu_xMn_y)P_{2+z}O_7$:$Eu_{2+}F$, $(Ba,Sr,Ca)Al_2O_4$:Eu, $((Ba,Sr,Ca)(Mg,Zn))Si_2O_7$:Eu, $SrGa_2S_4$:Eu, $((Ba,Sr,Ca)_{1-x}Eu_x)(Mg,Zn)_{1-x}Mn_x))Al_{10}O_{17}$, $Ca_8Mg(SiO_4)_4Cl_2$:Eu,Mn, $((Ba,Sr,Ca,Mg)_{1-x}Eu_x)_2SiO_4$, $Ca_2MgSi_2O_7$:Cl, $SrSi_3O_8·2SrCl_2$:Eu, BAM:Eu, Sr-Aluminate:Eu, Thiogallate:Eu, Chlorosilicate:Eu, Borate:Ce,Tb, $Sr_4Al_{14}O_{25}$:Eu, $YBO_3$:Ce,Tb, $BaMgAl_{10}O_{17}$:Eu,Mn, $(Sr,Ca,Ba)(Al,Ga)_2S_4$:Eu, $Ca_2MgSi_2O_7$:Cl,Eu,Mn, $(Sr,Ca,Ba,Mg)_{10}(PO_4)_6Cl_2$:Eu ZnS:Cu,Al, $(Y,Gd,Tb,Lu,Yb)(Al_yGa_{1-y})_5O_{12}$:Ce, $(Sr_{1-x-y-z}Ba_xCa_yEu_z)_2SiO_4$, and $(Sr_{1-a-b}Ca_bBa_c)Si_xN_yO_z$:$Eu_a$ $Sr_5(PO_4)_3Cl$:$Eu_a$, or a mixture material thereof, but the first fluorescent material 161 is not limited thereto, and the form of the first fluorescent material 161 is also not limited to the powder disclosed in the embodiment. Persons skilled in the art may add the first fluorescent material 161 into the second package material 160 in various forms according to practical fabrication requirements, for example, the first fluorescent material 161 is coated on the top surface of the second package material 160 in the form of colloid. When the illuminating light penetrates the second package material 160, the first fluorescent material 161 mixed in the second package material 160 provides a good reflection effect for the illuminating light.

Referring to FIG. 1, as the height size of the second enclosure 150 is substantially greater than that of the first enclosure 120, when the second package material 160 is filled in the second configuration area 151, and the second package material 160 and the second enclosure 150 have the same height, the second package material 160 covers the first enclosure 120, the LED 130 and the first package material 140 completely.

Figure 2:
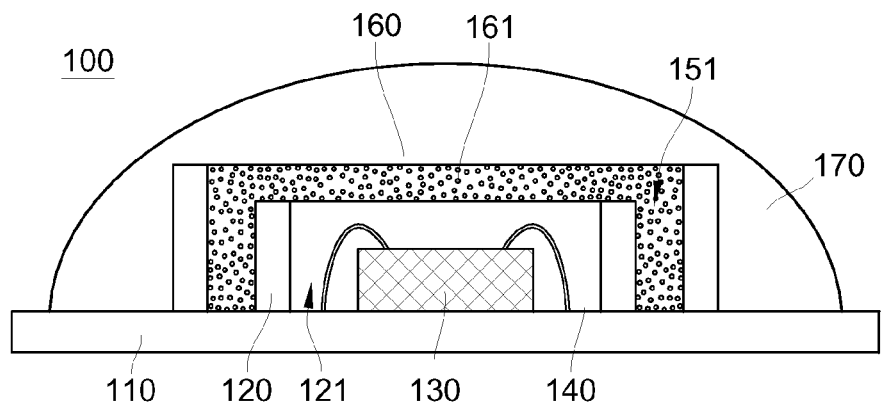
FIG. 2 is a side cross-sectional view of different aspects according to the first embodiment of the present invention.
Figure 3:
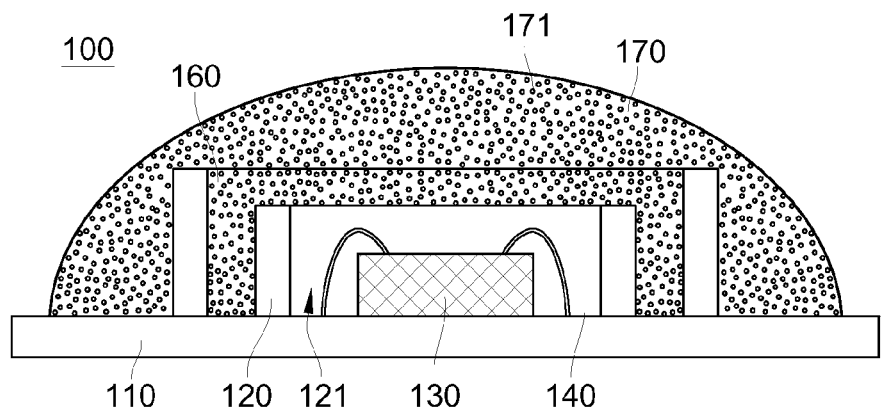
FIG. 3 is a side cross-sectional view of different aspects according to the first embodiment of the present invention.

FIGS. 2 and 3 are side cross-sectional views of different aspects according to the first embodiment of the present invention, and the implementation aspects disclosed in FIGS. 2 and 3 substantially have the same structure as the embodiment in FIG. 1, and only the differences between FIGS. 1, 2 and 3 would be described below.

As shown in FIG. 2, in addition to the substrate 110, the first enclosure 120, the LED 130, the first package material 140, the second enclosure 150, and the second package material 160, the LED package structure 100 of the present embodiment further includes a lens 170. The lens 170 covers the second enclosure 150 and the second package material 160, and the material of the lens 170 is a transparent material, for example, but not limited to, a polymer material or a glass material. The illuminating light emitted by the LED 130 is reflected to a wall surface of the lens 170, so the lens 170 can provide a better use of reflecting light.

Furthermore, as shown in FIG. 3, the lens 170 of the present embodiment may further have a second fluorescent material 171 in a powder form added therein, so as to improve the reflection effect of the lens 170. The second fluorescent material 171 added into the lens 170 is one selected from $Sr_{1-x-y}Ba_xCa_ySiO_4$:$Eu_{2+}F$, $(Sr_{1-x-y}Eu_xMn_y)P_{2+z}O_7$:$Eu_{2+}F$, $(Ba,Sr,Ca)Al_2O_4$:Eu, $((Ba,Sr,Ca)(Mg,Zn))Si_2O_7$:Eu, $SrGa_2S_4$:Eu, $((Ba,Sr,Ca)_{1-x}Eu_x)(Mg,Zn)_{1-x}Mn_x))Al_{10}O_{17}$, $Ca_8Mg(SiO_4)_4Cl_2$:Eu,Mn, $((Ba,Sr,Ca,Mg)_{1-x}Eu_x)_2SiO_4$, $Ca_2MgSi_2O_7$:Cl, $SrSi_3O_8·2SrCl_2$:Eu, BAM:Eu, Sr-Aluminate:Eu, Thiogallate:Eu, Chlorosilicate:Eu, Borate:Ce,Tb, $Sr_4Al_{14}O_{25}$:Eu, $YBO_3$:Ce,Tb, $BaMgAl_{10}O_{17}$:Eu,Mn, $(Sr,Ca,Ba)(Al,Ga)_2S_4$:Eu, $Ca_2MgSi_2O_7$:Cl,Eu,Mn, $(Sr,Ca,Ba,Mg)_{10}(PO_4)_6Cl_2$:Eu ZnS:Cu,Al, $(Y,Gd,Tb,Lu,Yb)(Al_yGa_{1-y})_5O_{12}$:Ce, $(Sr_{1-x-y-z}Ba_xCa_yEu_z)_2SiO_4$, and $(Sr_{1-a-b}Ca_bBa_c)Si_xN_yO_z$:$Eu_a$ $Sr_5(PO_4)_3Cl$:$Eu_a$, or a mixture material thereof, but the material of the second fluorescent material 171 is not limited thereto, and the form of the second fluorescent material 171 is not limited to the powder disclosed in the embodiment. Persons skilled in the art may add the second fluorescent material 171 into the lens 170 in various forms according to practical fabrication requirements. For example, the second fluorescent material 171 is coated on the surface of the lens 170 in the form of colloid. When the illuminating light penetrates the lens 170, the second fluorescent material 171 mixed in the lens 170 provides a better reflection effect for the illuminating light.

Figure 4:
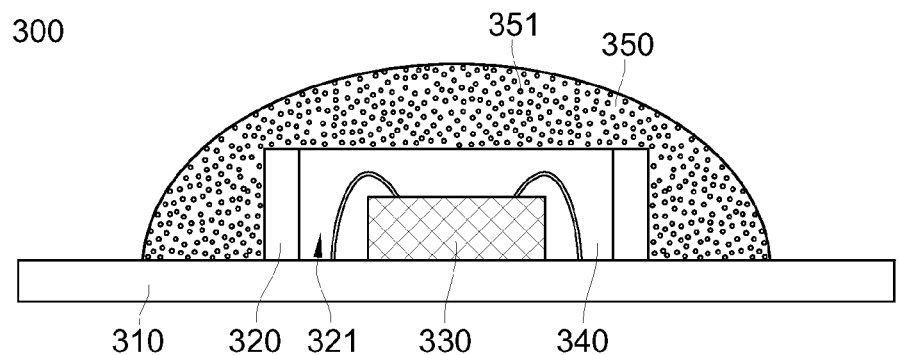
FIG. 4 is a side cross-sectional view according to a second embodiment of the present invention.

FIG. 4 is a side cross-sectional view according to a second embodiment of the present invention. As shown in FIG. 4, an LED package structure 300 according to the second embodiment of the present invention includes a substrate 310, an enclosure 320, at least one LED 330, a first package material 340, and a second package material 350. The material of the substrate 310 is, but not limited to, one selected from a metal material, a ceramic material, a diamond material, a diamond-like carbon material or a PCB.

The enclosure 320 is disposed on a top surface of the substrate 310, and encloses to form a configuration area 321 on the surface of the substrate 310. It should be noted that, the enclosure 320 and the substrate 310 of the embodiment are substantially perpendicular to each other. The material of the enclosure 320 is a transparent material, and the shape of the configuration area 321 formed by the enclosure 320 according to the embodiment is, for example, but not limited to, a rectangle, a circle, and an oval. Persons skilled in the art may design the configuration area 321 to various geometric shapes according to practical use requirements.

Furthermore, for optimizing the reflection of the light, the enclosure 320 may also be designed to be disposed on the substrate 310 at an angle of inclination, or the enclosure 320 may be designed to be, but not limited to, a trapezoid-like structure. Therefore, persons skilled in the art may further design the enclosure 320 of the present embodiment into forms of various geometric shapes and different placement angles according to practical use requirements.

As shown in FIG. 4, the LED 330 is disposed in the configuration area 321, that is, the LED 330 is located inside the enclosure 320. The LED 330 is electrically connected to an electrical source, and is driven by the electrical source to emit the illuminating light. The number of the configured LEDs 330 may be varied according to the practical use requirements, but is not limited to the one LED in the embodiment.

The color of the light emitted by the LED 330 according to the embodiment may be various colors, such as cool white, warm white, and white light imitating daylight. The illuminating light has high color rendering property, and the illuminating light of the present embodiment has the total reflection effect of normal reflection and horizontal reflection by means of the first enclosure 320, so as to avoid excessive light loss of the illuminating light during refraction.

Referring to FIG. 4 again, the first package material 340 is filled in the first configuration area 321, and covers the LED 330 completely. The material of the first package material 340 is a transparent material, for example, but not limited to, a polymer material such as epoxy and silicone. Moreover, the first package material 340 is, for example, but not limited to, disposed in the first configuration area 121 through a molding process.

The second package material 350 has a first fluorescent material 351 in the powder form added therein, and the second package material 350 covers the enclosure 320, the LED 330 and the first package material 340 completely, so as to form the complete LED package structure 300. The material of the second package material 350 is a transparent material, for example, but not limited to, a polymer material such as epoxy and silicone.

The first fluorescent material 351 added into the second package material 350 is one selected from Sr1-x-yBaxCaySiO4:Eu2+F, (Sr1-x-yEuxMny)P2+zO7: Eu2+F, (Ba,Sr,Ca)Al2O4:Eu, ((Ba,Sr,Ca)(Mg,Zn))Si2O7:Eu, SrGa2S4:Eu, ((Ba,Sr,Ca)1-xEux)(Mg,Zn)1-xMnx))Al10O17, Ca8Mg(SiO4)4Cl2:Eu,Mn, ((Ba,Sr,Ca,Mg)1-xEux)2SiO4, Ca2MgSi2O7:Cl, SrSi3O8·2SrCl2:Eu, BAM:Eu, Sr-Aluminate:Eu, Thiogallate:Eu, Chlorosilicate:Eu, Borate:Ce,Tb, Sr4Al14O25:Eu, YBO3:Ce,Tb, BaMgAl10O17:Eu,Mn, (Sr,Ca,Ba)(Al,Ga)2S4:Eu, Ca2MgSi2O7:Cl,Eu,Mn, (Sr,Ca,Ba,Mg)10(PO4)6Cl2:Eu ZnS:Cu,Al, (Y,Gd,Tb,Lu,Yb)(AlyGal-y)5O12:Ce, (Sr1-x-y-zBaxCayEuz)2SiO4, and (Sr1-a-bCabBac)SixNyOz:Eua Sr5(PO4)3Cl:Eua, or a mixture material thereof, but the material of the first fluorescent material 351 is not limited thereto, and the form of the first fluorescent material 351 is also not limited to the powder disclosed in the embodiment. Persons skilled in the art may add the first fluorescent material 351 into the first second package material 350 in various forms according to practical fabrication requirements, for example, the first fluorescent material 351 is coated on the top surface of the second package material 350 in the form of colloid. When the illuminating light penetrates the second package material 350, the first fluorescent material 351 mixed in the second package material 350 provides a better reflection effect for the illuminating light.

Figure 5:
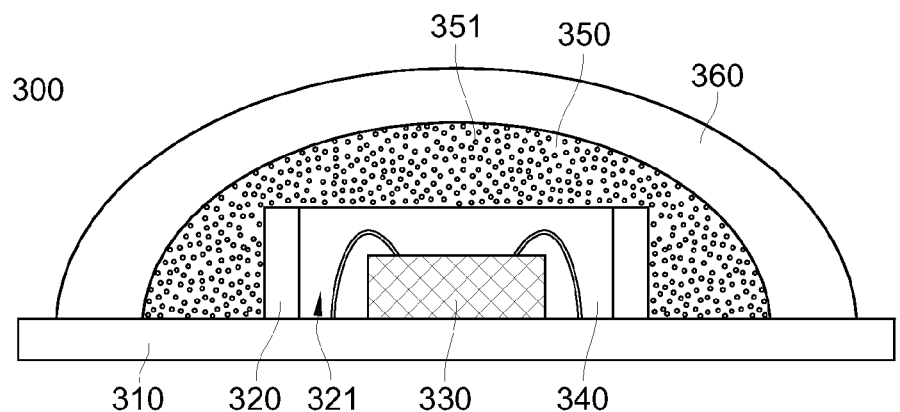
FIG. 5 is a side cross-sectional view of different aspects according to the second embodiment of the present invention.
Figure 6:
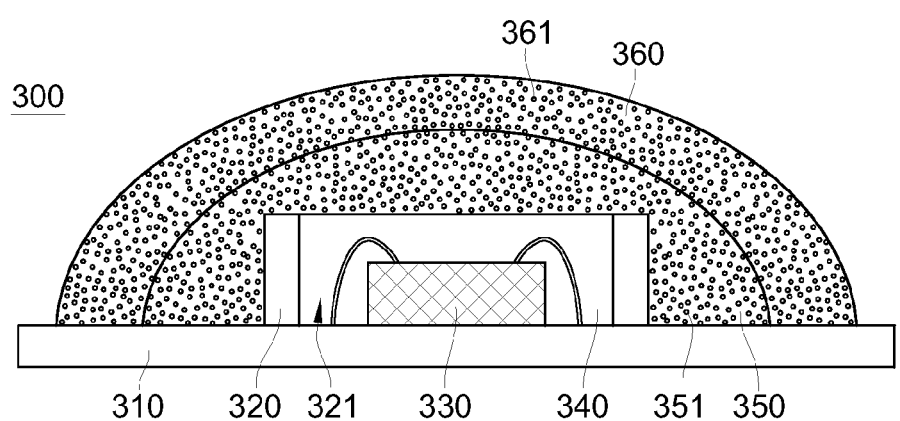
FIG. 6 is a side cross-sectional view of different aspects according to the second embodiment of the present invention.

FIGS. 5 and 6 are side cross-sectional views of different aspects according to the second embodiment of the present invention, and the implementation aspects disclosed in FIGS. 5 and 6 have substantially the same structure as the embodiment in FIG. 4, and only the differences between FIGS. 5 and 6 would be described illustrated below.

As shown in FIG. 5, in addition to the substrate 310, the enclosure 320, the LED 330, the first package material 340, and the second package material 350, the LED package structure 300 further includes a lens 360. The lens 360 covers the second package material 350, and the material of the lens 360 is transparent material, for example, but not limited to, a polymer material and a glass material. The illuminating light emitted by the LED 330 is reflected on a wall surface of the lens 360, so the lens 360 provides a better use of reflected light.

Furthermore, as shown in FIG. 6, the lens 360 of the present embodiment may further have a second fluorescent material 361 in a powder form added therein, so as to improve the reflection effect of the lens 360. The second fluorescent material 361 added into the lens 360 is one selected from $Sr_{1-x-y}Ba_xCa_ySiO_4$:$Eu^{2+}F$, $(Sr_{1-x-y}Eu_xMn_y)P_{2+z}O_7$:$Eu^{2+}F$, $(Ba,Sr,Ca)Al_2O_4$:Eu, $((Ba,Sr,Ca)(Mg,Zn))Si_2O_7$:Eu, $SrGa_2S_4$:Eu, $((Ba,Sr,Ca)_{1-x}Eu_x)(Mg,Zn)_{1-x}Mn_x))Al_{10}O_{17}$, $Ca_8Mg(SiO_4)_4Cl_2$:Eu,Mn, $((Ba,Sr,Ca,Mg)_{1-x}Eu_x)_2SiO_4$, $Ca_2MgSi_2O_7$:Cl, $SrSi_3O_{8\cdot 2}SrCl_2$:Eu, BAM:Eu, Sr-Aluminate:Eu, Thiogallate:Eu, Chlorosilicate:Eu, Borate:Ce,Tb, $Sr_4Al_{14}O_{25}$:Eu, $YBO_3$:Ce,Tb, $BaMgAl_{10}O_{17}$:Eu,Mn, $(Sr,Ca,Ba)(Al,Ga)_2S_4$:Eu, $Ca_2MgSi_2O_7$:Cl,Eu,Mn, $(Sr,Ca,Ba,Mg)_{10}(PO_4)_6Cl_2$:Eu ZnS:Cu,Al, $(Y,Gd,Tb,Lu,Yb)(Al_yGa_{1-y})_5O_{12}$:Ce, $(Sr_{1-x-y-z}Ba_xCa_yEu_z)_2SiO_4$, and $(Sr_{1-a-b}Ca_bBa_c)Si_xN_yO_z$:$Eu_a$ $Sr_5$ $(PO_4)_3Cl$:$Eu_a$, or a mixture material thereof, but the material of the second fluorescent material 361 is not limited thereto, and the form of the second fluorescent material 361 is not limited to the powder disclosed in the embodiment. Persons skilled in the art may add the second fluorescent material 361 into the lens 360 in various forms according to practical fabrication requirements. For example, the second fluorescent material 361 is coated on the surface of the lens 360 in the form of colloid. When the illuminating light penetrates the lens 360, the second fluorescent material 361 mixed in the lens 360 provides a better reflection effect for the illuminating light.

Because of the configuration relationship that the LED and the package material having the fluorescent material are separated from each other without direct contact (remote phosphor), a certain distance exists between the LED and the fluorescent material for reflecting the light. Therefore, the overall luminance performance of the LED package structure and the uniformity of the reflected light of the LED package structure can be improved. Moreover, the package structure of the present invention can be applicable in both LED forms including a vertical light emitting type and a horizontal light emitting type.

As in the LED the fluorescent material is remote from the heat source, that is to say, the fluorescent material does not directly contact the LED, so the LED package structure is applicable in a package structure having multiple LEDs, the reliability of the LED package structure is improved. Thus, the LED package structure is applicable in a package structure of a plurality of LEDs, and the manufacturing cost is reduced at the same time.

Furthermore, the LED package structure of the present invention may further have a lens disposed outside the second package material, so as to further improve the overall luminance performance of the LED package structure.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A light emitting diode (LED) package structure, comprising:

a substrate;

a first enclosure, disposed on a surface of the substrate, and enclosing to form a first configuration area on the substrate, and a material of the first enclosure is a transparent material;

at least one LED, disposed in the first configuration area and used for emitting illuminating light;

a first package material, disposed in the first configuration area, and covering the LED, wherein a material of the first package material is a transparent material;

a second enclosure, disposed on the surface of the substrate and outside the first enclosure, and forming a second configuration area with the first enclosure, wherein a material of the second enclosure is a transparent material; and a second package material, having a first fluorescent material added therein, disposed in the second configuration area, and covering the first enclosure, the LED, and the first package material.

2. The LED package structure according to claim 1, further comprising a lens, covering the second enclosure and the second package material.

3. The LED package structure according to claim 2, wherein a material of the lens is a transparent material.

4. The LED package structure according to claim 2, wherein the lens further comprises a second fluorescent material, and the second fluorescent material is one selected from $Sr_{1-x-y}Ba_xCa_ySiO_4:Eu^{2+}F$, $(Sr_{1-x-y}Eu_xMn_y)P_{2+z}O_7:Eu^{2+}F$, $(Ba,Sr,Ca)Al_2O_4:Eu$, $((Ba,Sr,Ca)(Mg,Zn))Si_2O_7:Eu$, $SrGa_2S_4:Eu$, $((Ba,Sr,Ca)_{1-x}Eu_x)(Mg,Zn)_{1-x}Mn_x))Al_{10}O_{17}$, $Ca_8Mg(SiO_4)_4Cl_2:Eu,Mn$, $((Ba,Sr,Ca,Mg)_{1-x}Eu_x)_2SiO_4$, $Ca_2MgSi_2O_7:Cl$, $SrSi_3O_8 2SrCl_2:Eu$, BAM:Eu, Sr-Aluminate:Eu, Thiogallate:Eu, Chlorosilicate:Eu, Borate:Ce,Tb, $Sr_4Al_{14}O_{25}:Eu$, $YBO_3:Ce,Tb$, $BaMgAl_{10}O_{17}:Eu,Mn$, $(Sr,Ca,Ba)(Al,Ga)_2S_4:Eu$, $Ca_2MgSi_2O_7:Cl,Eu,Mn$, $(Sr,Ca,Ba,Mg)_{10}(PO_4)_6Cl_2:Eu$ $ZnS:Cu,Al$, $(Y,Gd,Tb,Lu,Yb)(Al_y,Ga_{1-y})_5O_{12}:Ce$, $(Sr_{1-x-y-z}Ba_xCa_yEu_z)_2SiO_4$, and $(Sr_{1-a-b}Ca_{b-}Ba_c)Si_xN_yO_z:Eu_aSr_5(PO_4)_3Cl:Eu_a$ or a mixture material thereof.

5. The LED package structure according to claim 1, wherein a height size of the second enclosure is substantially greater than that of the first enclosure.

6. The LED package structure according to claim 1, wherein the first fluorescent material is one selected from $Sr_{1-x-y}Ba_xCa_ySiO_4:Eu^{2+}F$, $(Sr_{1-x-y}Eu_xMn_y)P_{2+z}O_7:Eu^{2+}F$, $(Ba,Sr,Ca)Al_2O_4:Eu$, $((Ba,Sr,Ca)(Mg,Zn))Si_2O_7:Eu$, $SrGa_2S_4:Eu$, $((Ba,Sr,Ca)_{1-x}Eu_x)(Mg,Zn)_{1-x}Mn_x))Al_{10}O_{17}$, $Ca_8Mg(SiO_4)_4Cl_2:Eu,Mn$, $((Ba,Sr,Ca,Mg)_{1-x}Eu_x)_2SiO_4$, $Ca_2MgSi_2O_7:Cl$, $SrSi_3O_8 2SrCl_2:Eu$, BAM:Eu, Sr-Aluminate:Eu, Thiogallate:Eu, Chlorosilicate:Eu, Borate:Ce,Tb, $Sr_4Al_{14}O_{25}:Eu$, $YBO_3:Ce,Tb$, $BaMgAl_{10}O_{17}:Eu,Mn$, $(Sr,Ca,Ba)(Al,Ga)_2S_4:Eu$, $Ca_2MgSi_2O_7:Cl,Eu,Mn$, $(Sr,Ca,Ba,Mg)_{10}(PO_4)_6Cl_2:Eu$ $ZnS:Cu,Al$, $(Y,Gd,Tb,Lu,Yb)(Al_y,Ga_{1-y})_5O_{12}:Ce$, $(Sr_{1-x-y-z}Ba_xCa_yEu_z)_2SiO_4$, and $(Sr_{1-a-b}Ca_{b-}Ba_c)Si_xN_yO_z:Eu_aSr_5(PO_4)_3Cl:Eu_a$, or a mixture material thereof.

7. The LED package structure according to claim 1, wherein a material of the substrate is one selected from a metal material, a ceramic material, a diamond material, a diamond-like carbon material or a printed circuit board (PCB).

8. The LED package structure according to claim 1, wherein materials of the first package material and the second package material are epoxy or silicone.

9. The LED package structure according to claim 1, wherein a shape of the first configuration area formed by the first enclosure is a rectangle, a circle or an oval.

10. The LED package structure according to claim 1, wherein a shape of the second configuration area formed by the second enclosure is a rectangle, a circle, or an oval.

11. A light emitting diode (LED) package structure, comprising:
a substrate;
an enclosure, disposed on a surface of the substrate, and enclosing to form a configuration area on the substrate, wherein a material of the enclosure is a transparent material;
at least one LED, disposed in the configuration area, and used for emitting an illuminating light;
a first package material, disposed in the configuration area, and covering the LED, wherein a material of the first package material is a transparent material; and
a second package material, having a first fluorescent material added therein, and covering the enclosure, the LED, and the first package material.

12. The LED package structure according to claim 11, further comprising a lens, covering the second package material.

13. The LED package structure according to claim 12, wherein a material of the lens is a transparent material.

14. The LED package structure according to claim 12, wherein the lens further comprises a second fluorescent material, and the second fluorescent material is one selected from $Sr_{1-x-y}Ba_xCa_ySiO_4:Eu^{2+}F$, $(Sr_{1-x-y}Eu_xMn_y)P_{2+z}O_7:Eu^{2+}F$, $(Ba,Sr,Ca)Al_2O_4:Eu$, $((Ba,Sr,Ca)(Mg,Zn))Si_2O_7:Eu$, $SrGa_2S_4:Eu$, $((Ba,Sr,Ca)_{1-x}Eu_x)(Mg,Zn)_{1-x}Mn_x))Al_{10}O_{17}$, $Ca_8Mg(SiO_4)_4Cl_2:Eu,Mn$, $((Ba,Sr,Ca,Mg)_{1-x}Eu_x)_2SiO_4$, $Ca_2MgSi_2O_7:Cl$, $SrSi_3O_8 2SrCl_2:Eu$, BAM:Eu, Sr-Aluminate:Eu, Thiogallate:Eu, Chlorosilicate:Eu, Borate:Ce,Tb, $Sr_4Al_{14}O_{25}:Eu$, $YBO_3:Ce,Tb$, $BaMgAl_{10}O_{17}:Eu,Mn$, $(Sr,Ca,Ba)(Al,Ga)_2S_4:Eu$, $Ca_2MgSi_2O_7:Cl,Eu,Mn$, $(Sr,Ca,Ba,Mg)_{10}(PO_4)_6Cl_2:Eu$ $ZnS:Cu,Al$, $(Y,Gd,Tb,Lu,Yb)(Al_y,Ga_{1-y})_5O_{12}:Ce$, $(Sr_{1-x-y-z}Ba_xCa_yEu_z)_2SiO_4$, and $(Sr_{1-a-b}Ca_{b-}Ba_c)Si_xN_yO_z:Eu_aSr_5(PO_4)_3Cl:Eu_a$, or a mixture material thereof.

15. The LED package structure according to claim 11, wherein the first fluorescent material is one selected from $Sr_{1-x-y}Ba_xCa_ySiO_4:Eu^{2+}F$, $(Sr_{1-x-y}Eu_xMn_y)P_{2+z}O_7:Eu^{2+}F$, $(Ba,Sr,Ca)Al_2O_4:Eu$, $((Ba,Sr,Ca)(Mg,Zn))Si_2O_7:Eu$, $SrGa_2S_4:Eu$, $((Ba,Sr,Ca)_{1-x}Eu_x)(Mg,Zn)_{1-x}Mn_x))Al_{10}O_{17}$, $Ca_8Mg(SiO_4)_4Cl_2:Eu,Mn$, $((Ba,Sr,Ca,Mg)_{1-x}Eu_x)_2SiO_4$, $Ca_2MgSi_2O_7:Cl$, $SrSi_3O_8 2SrCl_2:Eu$, BAM:Eu, Sr-Aluminate:Eu, Thiogallate:Eu, Chlorosilicate:Eu, Borate:Ce,Tb, $Sr_4Al_{14}O_{25}:Eu$, $YBO_3:Ce,Tb$, $BaMgAl_{10}O_{17}:Eu,Mn$, $(Sr,Ca,Ba)(Al,Ga)_2S_4:Eu$, $Ca_2MgSi_2O_7:Cl,Eu,Mn$, $(Sr,Ca,Ba,Mg)_{10}(PO_4)_6Cl_2:Eu$ $ZnS:Cu,Al$, $(Y,Gd,Tb,Lu,Yb)(Al_y,Ga_{1-y})_5O_{12}:Ce$, $(Sr_{1-x-y-z}Ba_xCa_yEu_z)_2SiO_4$, and $(Sr_{1-a-b}Ca_{b-}Ba_c)Si_xN_yO_z:Eu_aSr_5(PO_4)_3Cl:Eu_a$, or a mixture material thereof.

16. The LED package structure according to claim 11, wherein a material of the substrate is one selected from a metal material, a ceramic material, a diamond material, a diamond-like carbon material or a printed circuit board (PCB).

17. The LED package structure according to claim 11, wherein materials of the first package material and the second package material are epoxy or silicone.

18. The LED package structure according to claim 11, wherein a shape of the configuration area formed by the enclosure is a rectangle, a circle, or an oval.

* * * * *